US012713556B2

(12) United States Patent
Zhang et al.

(10) Patent No.: US 12,713,556 B2
(45) Date of Patent: Aug. 18, 2026

(54) VEHICLE TEMPERATURE CONTROL SYSTEM

(71) Applicant: Yinwang Intelligent Technologies Co., Ltd., Shenzhen (CN)

(72) Inventors: Xingxin Zhang, Chengdu (CN); Xuehuan Wang, Chengdu (CN)

(73) Assignee: YINWANG INTELLIGENT TECHNOLOGIES CO., LTD., Shenzhen (CN)

( * ) Notice: Subject to any disclaimer, the term of this patent is extended or adjusted under 35 U.S.C. 154(b) by 393 days.

(21) Appl. No.: 17/703,133

(22) Filed: Mar. 24, 2022

(65) Prior Publication Data

US 2022/0217869 A1 Jul. 7, 2022

Related U.S. Application Data

(63) Continuation of application No. PCT/CN2020/092931, filed on May 28, 2020.

(30) Foreign Application Priority Data

Sep. 25, 2019 (CN) ......................... 201910913465.9

(51) Int. Cl.
*H05K 7/20* (2006.01)

(52) U.S. Cl.
CPC ..... *H05K 7/20272* (2013.01); *H05K 7/20281* (2013.01); *H05K 7/20509* (2013.01)

(58) Field of Classification Search
CPC ........... H05K 7/20272; H05K 7/20254; B60K 2001/005
See application file for complete search history.

(56) References Cited

U.S. PATENT DOCUMENTS 6,396,692 B1 * 5/2002 Farshi ................ H05K 7/20872 123/41.31
8,082,743 B2 * 12/2011 Hermann ............ H01M 10/613 62/244
2013/0208421 A1 * 8/2013 Chester ............. H05K 7/20281 165/104.31
2018/0229620 A1 * 8/2018 Yamanaka ............... B60K 6/48
(Continued)

FOREIGN PATENT DOCUMENTS

CN 205523538 U 8/2016
CN 106058369 A 10/2016
(Continued)

OTHER PUBLICATIONS

Helge Zinner et al., "Automotive E/E Architecture evolution and the impact on the network," IEEE802 Plenary, Mar. 2019, 802.1 TSN, 10 pages.

*Primary Examiner* — Devon Lane
(74) *Attorney, Agent, or Firm* — Conley Rose, P.C.

(57) ABSTRACT

A vehicle temperature control system includes an in-vehicle control unit temperature control flow path, a battery temperature control flow path, a heat exchange unit configured to provide temperature control fluid for the in-vehicle control unit temperature control flow path and the battery temperature control flow path, and a control valve unit configured to control the in-vehicle control unit temperature control flow path and the battery temperature control flow path to be connected in parallel or series.

20 Claims, 9 Drawing Sheets

(56) References Cited

U.S. PATENT DOCUMENTS

| | | | | |
|---|---|---|---|---|
| 2018/0292870 | A1* | 10/2018 | Wischnesky | G06F 1/20 |
| 2018/0309140 | A1* | 10/2018 | Grass | H01M 10/613 |
| 2019/0168569 | A1* | 6/2019 | Lee | B60L 58/26 |
| 2019/0210426 | A1 | 7/2019 | Shan et al. | |
| 2019/0288353 | A1* | 9/2019 | Harris | H01M 10/6555 |

FOREIGN PATENT DOCUMENTS

| | | | | |
|---|---|---|---|---|
| CN | 206282947 | U | * | 6/2017 |
| CN | 107683071 | A | | 2/2018 |
| CN | 207859942 | U | | 9/2018 |
| CN | 108790681 | A | | 11/2018 |
| CN | 109263433 | A | | 1/2019 |
| CN | 109599614 | A | | 4/2019 |
| CN | 109713382 | A | | 5/2019 |
| CN | 208962849 | U | | 6/2019 |
| CN | 110014805 | A | | 7/2019 |
| CN | 110048189 | A | | 7/2019 |
| DE | 102011016070 | A1 | | 10/2012 |
| FR | 2946415 | A1 | | 12/2010 |
| JP | 2011153785 | A | | 8/2011 |
| JP | 2013149920 | A | * | 8/2013 |
| JP | 2016137773 | A | | 8/2016 |
| JP | 2018125419 | A | | 8/2018 |
| JP | 2018127164 | A | | 8/2018 |
| JP | 2019156108 | A | | 9/2019 |
| WO | 2018185001 | A1 | | 10/2018 |

* cited by examiner

2000
Control board A
Control board B
Control board C

2000
Control board A
Control board B
Control board C 2000
2001
Control board A
Control board B
Control board C

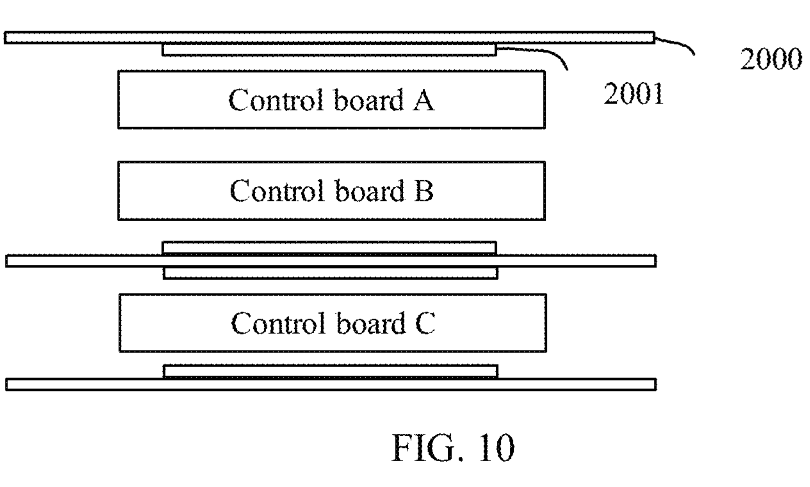
FIG. 10
2112
2111
2000
2111
FIG. 11
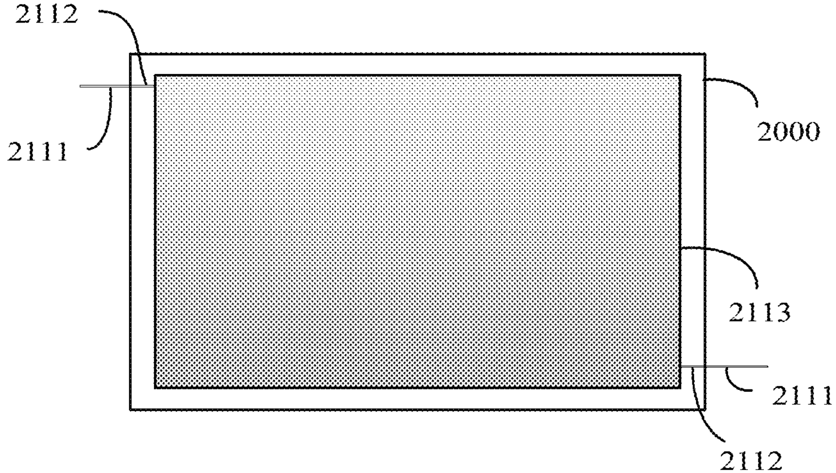
FIG. 12

VEHICLE TEMPERATURE CONTROL SYSTEM

CROSS-REFERENCE TO RELATED APPLICATION

This is a continuation of International Patent Application No. PCT/CN2020/092931 filed on May 28, 2020, which claims priority to Chinese Patent Application No. 201910913465.9 filed on Sep. 25, 2019. The disclosures of the aforementioned applications are hereby incorporated by reference in their entireties.

TECHNICAL FIELD

This application relates to a vehicle temperature control system, applied to temperature regulation and control of an in-vehicle control unit and a battery in a vehicle.

BACKGROUND

In recent years, intelligent driving of vehicles, from research and development to manufacturing, has become pretty popular, featuring high investment and rapid technological progress. In the field of intelligent driving, a core structural component is an in-vehicle chip.

The Institute of Electrical and Electronics Engineers (IEEE) 802.1 standard planned, at the end of 2018, to start to develop standards for in-vehicle Ethernet communications (P802.1DG-TSN Profile for Automotive In-Vehicle Ethernet Communications). The development proposal for electrical/electronic architecture (E/E Architecture) mentions a development trend of the vehicle E/E architecture from a current conventional distributed architecture in use, to a domain-centralized architecture in development, and to a central computer architecture in the future. For the domain-centralized architecture and the central computer architecture, a domain gateway and a zone gateway are used as key components to aggregate data of a plurality of engine controllers (Engine control unit (ECU)). Many features of intelligent driving usually also lie in the gateway, and a load of the gateway is relatively heavy. Therefore, a lot of heat is generated during working.

For a non-vehicle chip, such as a computer chip or a mobile phone chip, the chip is equipped with a built-in overheat protection module. When a working temperature of the chip exceeds a threshold, the overheat protection module in the chip intervenes by forcing the chip to work intermittently or reducing a working frequency of the chip, to reduce working intensity of the chip. However, as a core electronic component in a vehicle, the in-vehicle chip needs to receive signal information that changes in real time (including road conditions outside the vehicle, engine running conditions inside the vehicle, and the like) collected by a sensor, react in time, perform calculation and processing, and make decisions during working. Working stability of the in-vehicle chip is an important guarantee for safety of intelligent driving. If a temperature of the in-vehicle chip is too high during working, working efficiency of the in-vehicle chip is inevitably affected and the working stability of the chip is reduced. Therefore, it is necessary to avoid occurrence of overtemperature of the in-vehicle chip during working.

In addition, when a vehicle runs in a cold environment, a control unit such as the in-vehicle chip is also affected by a low temperature, and stability during running cannot be ensured.

Based on the foregoing technical background, how to effectively adjust and control the temperature of the in-vehicle control unit is an important problem to be solved in the automobile field.

SUMMARY

In view of this, this application provides a vehicle temperature control system, to implement temperature adjustment and control on an in-vehicle control unit, and to ensure running stability when the in-vehicle control unit bears a high load or works in a cold environment.

The above objectives will be achieved by the features in the independent claims, and the other objectives will be achieved by the features in the independent claims. Further implementations are embodied in the dependent claims, the specification, and accompanying drawings.

According to a first aspect, a vehicle temperature control system is provided, including, an in-vehicle control unit temperature control flow path configured to perform temperature control for an in-vehicle control unit, where the in-vehicle control unit temperature control flow path flows through temperature control branches to perform temperature control on the in-vehicle control unit, there are two or more temperature control branches, and at least one temperature control branch passes through the inside of the in-vehicle control unit, a battery temperature control flow path, configured to perform temperature control for battery units, where there are a plurality of battery units, the battery temperature control flow path is shunted to a plurality of battery unit temperature control branches to respectively perform temperature control on the plurality of battery units, and each battery unit temperature control branch corresponds to one battery unit, a heat exchange unit including an output port and a backflow port, and configured to provide temperature control fluid for the in-vehicle control unit temperature control flow path and the battery temperature control flow path, and a control valve unit configured to control the in-vehicle control unit temperature control flow path and the battery temperature control flow path to be connected in parallel or series.

According to the vehicle temperature control system provided in the first aspect, the temperature control system performs temperature control for the battery and control unit at the same time, thereby simplifying an arrangement of temperature control pipes in a vehicle.

The temperature control branch passes through the inside of the in-vehicle control unit, so that temperature control efficiency can be significantly improved. If the temperature control branch is arranged only at a periphery of the in-vehicle control unit, heat exchange between the temperature control fluid and the in-vehicle control unit cannot be realized quickly and sufficiently. When an external environment temperature is relatively high or the in-vehicle control unit bears a relatively high load, a temperature of the in-vehicle control unit is also relatively high during running correspondingly. The temperature control system quickly cools the in-vehicle control unit down, thereby avoiding running efficiency reduction or even a failure caused by the relative high temperature of the in-vehicle control unit, and ensuring running stability of the in-vehicle control unit. In addition, when the external environment temperature is relatively low, the temperature control system may also quickly heat the in-vehicle control unit up, thereby ensuring running performance of the in-vehicle control unit, and avoiding slow or unsmooth running of the in-vehicle control unit due to a cold environment.

In addition, the vehicle temperature control system is provided with the control valve unit, which can control the in-vehicle control unit temperature control flow path and the battery temperature control flow path to be connected in parallel or series. By using this structure, a temperature control path can be flexibly switched based on different temperature control requirements.

When the in-vehicle control unit temperature control flow path and the battery temperature control flow path are connected in parallel, the temperature control fluid in the system has a higher flow speed because a single temperature control flow path and the heat exchange unit each form an independent circulation path, and the circulation path is simple, thereby facilitating fast temperature control of the in-vehicle control unit and the battery unit. In a case in which temperature values of the in-vehicle control unit and the battery unit do not deviate much from desired temperature values (for example, when a vehicle starts steady driving after warming up its engine in cold weather, or when a battery or control unit has been cooled down in hot weather or under a condition in which the battery or control unit bears a high load), temperature control requirements of the in-vehicle control unit and the battery unit are not high. In this case, by using the control valve unit, the temperature control path is switched to a state that the in-vehicle control unit temperature control flow path and the battery temperature control flow path are connected in series, so that the flow speed of the temperature control fluid can be slowed down and temperature control intensity of the system can be reduced. Thus, the temperature values of the units (the in-vehicle control unit and the battery unit) to be controlled in temperature are kept within a constant desired temperature range.

In another scenario, when the vehicle is started in a cold climate, both the battery and the in-vehicle control unit need to be heated up. For example, both the battery and the in-vehicle control unit are −20° C., and a temperature of the temperature control fluid is 20° C. In this case, to quickly heat the battery and the in-vehicle control unit up, the temperature control fluid needs to circulate quickly in the temperature control system. Therefore, in this case, the in-vehicle control unit temperature control flow path and the battery temperature control flow path are set to be connected in parallel. As the vehicle starts, the temperature of the in-vehicle control unit is increased quickly due to a small size and heat generated during working. For example, the temperature of the in-vehicle control unit is increased to 40° C., while the temperature of the battery is still 5° C. In this case, the temperature control path is switched to a state that the in-vehicle control unit temperature control flow path and the battery temperature control flow path are connected in series, so that complementary temperature control can be performed on the in-vehicle control unit and the battery unit.

According to the first aspect, in a first possible implementation of the vehicle temperature control system, there are a plurality of in-vehicle control units, the in-vehicle control unit temperature control flow path is shunted to a plurality of control unit temperature control branches to respectively perform temperature control on the plurality of in-vehicle control units, and each control unit temperature control branch corresponds to one in-vehicle control unit.

By using the vehicle temperature control system provided in this manner, temperature control can be performed for the plurality of in-vehicle control units relatively independently, and temperature control processes of the plurality of in-vehicle control units do not affect each other. In addition, according to the vehicle temperature control system, when an in-vehicle control unit is added, a new in-vehicle control unit temperature control flow path may be introduced accordingly to perform temperature control on the added in-vehicle control unit, which shows a flexible pluggable feature.

According to the first aspect, in a second possible implementation of the vehicle temperature control system, there are a plurality of in-vehicle control units, and the plurality of in-vehicle control units are connected in series.

By using the vehicle temperature control system provided in this manner, temperature control can be performed for the plurality of in-vehicle control units at the same time with the simple arrangement of the temperature control pipes.

According to the first aspect, or any implementation of the first aspect above, in a third possible implementation of the vehicle temperature control system, the control valve unit includes a first control valve and a second control valve, where the first control valve is disposed at a joint between upstream flow paths of the in-vehicle control unit temperature control flow path and the battery temperature control flow path, and the second control valve is disposed on a downstream flow path of the in-vehicle control unit temperature control flow path or the battery temperature control flow path.

By using the vehicle temperature control system provided in this manner, the first control valve and the second control valve are used to form the control valve unit, and a flow path of the temperature control fluid in the vehicle temperature control system is controlled by controlling outlet flow directions of the first control valve and the second control valve, which contributes to a simple structure and relatively high operation stability.

According to a second aspect, a vehicle temperature control system is provided, including an in-vehicle control unit temperature control flow path, configured to perform temperature control for an in-vehicle control unit, where the in-vehicle control unit temperature control flow path flows through temperature control branches to perform temperature control on the in-vehicle control unit, there are two or more temperature control branches, and at least one temperature control branch passes through the inside of the in-vehicle control unit, a heat exchange unit, including an output port and a backflow port, and configured to provide temperature control fluid for the in-vehicle control unit temperature control flow path, and a temperature control backbone pipe, where the temperature control backbone pipe includes an upstream main pipe and a downstream main pipe, the upstream main pipe communicates with the output port of the heat exchange unit and an upstream port of the in-vehicle control unit temperature control flow path separately, and the downstream main pipe communicates with a downstream port of the in-vehicle control unit temperature control flow path and the backflow port of the heat exchange unit separately.

According to the vehicle temperature control system provided in the second aspect, in a manner of disposing two main temperature control pipes and connecting the in-vehicle control unit temperature control flow path between the two main pipes, a temperature of the in-vehicle control unit is controlled under distributed deployment of the temperature control system, which helps improve space utilization efficiency of a vehicle. In addition, according to the flow path design, power of the heat exchange unit can be more compatible with the in-vehicle control unit temperature control flow path. To be specific, even if a power of the heat exchange unit is relatively large and a flow speed of flowing the temperature control fluid is relatively high, a flow pressure to the in-vehicle control unit temperature control flow path will not be too large. Therefore, based on the vehicle temperature control system, working stability of temperature control on the in-vehicle control unit can be effectively ensured.

According to the second aspect, in a first possible implementation of the vehicle temperature control system, there are a plurality of in-vehicle control units, an upstream port of each in-vehicle control unit temperature control flow path communicates with the upstream main pipe, and a downstream port of each in-vehicle control unit temperature control flow path communicates with the downstream main pipe.

In this arrangement manner, two main temperature control pipes are disposed based on positions of the plurality of in-vehicle control units. A plurality of in-vehicle control unit temperature control flow paths is disposed between the two main temperature control pipes to perform temperature control on the in-vehicle control units based on a quantity of in-vehicle control units to be controlled in temperature. The overall flow path design is simpler, and a temperature control flow path of each in-vehicle control unit is independent and does not interfere with each other.

According to the second aspect or the first possible implementation of the second aspect, in a second possible implementation of the vehicle temperature control system, the vehicle temperature control system further includes a battery temperature control flow path, configured to perform temperature control for battery units, where there are a plurality of battery units, the battery temperature control flow path is shunted to a plurality of battery unit temperature control branches to respectively perform temperature control on the plurality of battery units, and each battery unit temperature control branch corresponds to one battery unit, and an upstream port of the battery temperature control flow path communicates with the upstream main pipe, and a downstream port of the battery temperature control flow path communicates with the downstream main pipe. In this implementation, temperature control may be performed on both the battery and the in-vehicle control unit, thereby improving temperature control efficiency and simplifying an arrangement of a vehicle temperature control system path.

According to the second aspect, or any implementation of the second aspect above, in a third possible implementation of the vehicle temperature control system, the vehicle temperature control system further includes a temperature sensor control unit that controls a flow speed or flow rate of the temperature control fluid based on a collected temperature signal. The temperature sensor control unit includes a temperature sensor module, a control module, and a flow control valve, where the temperature sensor module is installed or integrated on the in-vehicle control unit, the temperature sensor module is connected to the control module through a wired or wireless signal, the flow control valve is disposed on the temperature control branch or temperature control flow path to control the flow rate of the flow-in temperature control fluid, and the control module controls the flow control valve based on the collected temperature signal of the temperature sensor module. According to this implementation, the vehicle temperature control system can accurately control a temperature of each in-vehicle communications device.

According to any one of the first aspect or the implementations of the first aspect, or any one of the second aspect or the implementations of the second aspect, in a fourth possible implementation of the vehicle temperature control system, the in-vehicle control unit includes at least one control board, a temperature control plate is disposed on one side or both sides of each control board, and the temperature control branch communicates with the inside of the temperature control plate. According to this implementation, the temperature control branch flows through the inside of the temperature control plate, and contact heat transfer is performed on the in-vehicle control unit by using the temperature control plate, thereby improving temperature conduction efficiency.

According to the fourth possible implementation of the first aspect or the second aspect, in a fifth possible implementation of the vehicle temperature control system, the temperature control plate is provided with a guide channel internally, and further provided with a liquid storage chamber, where the guide channel communicates with the temperature control branch. This implementation defines a manner in which the temperature control branch communicates with the temperature control plate. By using the structure, the temperature control fluid flows from the temperature control branch into the guide channel in the temperature control plate, to implement a temperature control function of the temperature control plate. In one structure mode, the liquid storage chamber is provided in the temperature control plate. The structure simplifies a manufacturing process of the temperature control plate and ensures the temperature control efficiency.

According to the fourth possible implementation or fifth possible implementation of the first aspect or the second aspect, in a sixth possible implementation of the vehicle temperature control system, a heat dissipation plate is further disposed on one side or both sides of the control board, and the heat dissipation plate is distributed between the control board and the temperature control plate. In this implementation, the heat dissipation plate is disposed between the temperature control plate and the control board, so that a temperature conduction speed can be increased, and the temperature control efficiency can be improved.

These aspects and other aspects of this application are clearer and easier to understand in descriptions of the following embodiments.

BRIEF DESCRIPTION OF DRAWINGS

To describe the technical solutions in embodiments of this application more clearly, the following briefly describes the accompanying drawings for describing the embodiments. It is clear that the accompanying drawings in the following descriptions show some embodiments of this application, and a person of ordinary skill in the art may still derive other drawings from these accompanying drawings without creative efforts.

FIG. 7 to FIG. 10 are schematic diagrams of four internal structures of an in-vehicle control unit used to implement one or more embodiments of this application;

FIG. 11 is a schematic diagram of an internal structure of a temperature control plate used to implement one or more embodiments of this application; and FIG. 12 is a schematic diagram of another internal structure of a temperature control plate used to implement one or more embodiments of this application.

DESCRIPTIONS OF REFERENCE NUMERALS

Figure 1A:
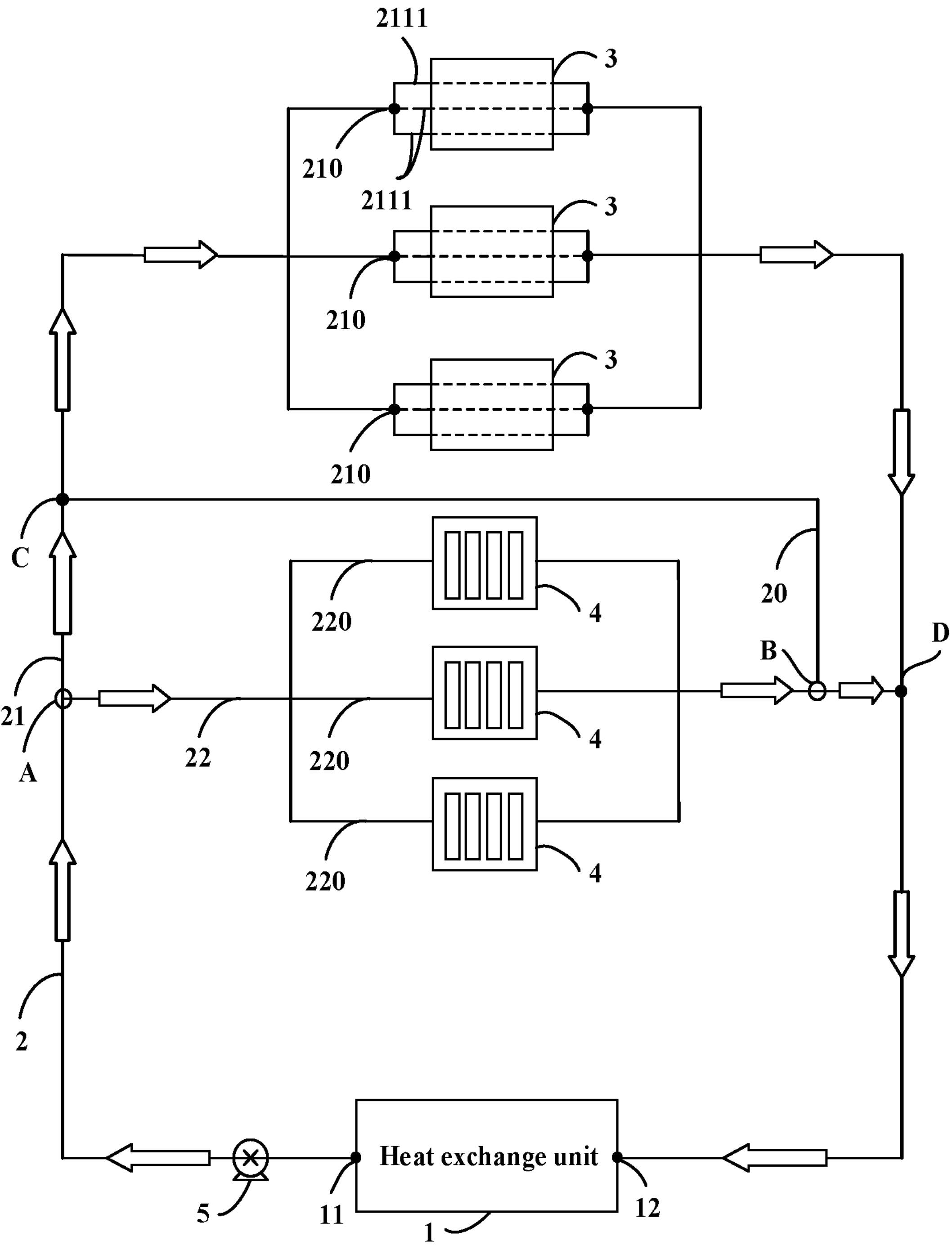
FIG. 1A is a schematic diagram of parallel flow paths of a vehicle temperature control system according to Embodiment 1 of this application.

1: Heat exchange unit; 11: Output port; 12: Backflow port; 2: Temperature control backbone pipe; 20: Bridge pipe; 21: In-vehicle control unit temperature control flow path; 22: Battery temperature control flow path; 210: Control unit temperature control branch; 220: Battery unit temperature control branch; 2111: Temperature control branch; 2A: Upstream main pipe; 2B: Downstream main pipe; 2000: Temperature control plate; 2001: Heat transfer plate; 2112: Guide channel; 2113: Liquid storage chamber; 3: In-vehicle control unit; 4: Battery unit; 5: Circulating pump; 6: Temperature sensor module; 7: Temperature control unit; 8: Flow control valve;

A and B: Three-way valve capable of controlling an outlet direction; C, D, E, F, G, H, I, J, K, and L: Three-way valve.

DESCRIPTION OF EMBODIMENTS

To make the objectives, technical solutions, and advantages of embodiments of this application clearer, the following clearly describes the technical solutions in the embodiments of this application with reference to accompanying drawings in the embodiments of this application. It is clear that, the described embodiments are merely some rather than all of the embodiments of this application. All other embodiments obtained by a person of ordinary skill in the art based on the embodiments of this application without creative efforts shall fall within the protection scope of this application.

Some technical terms in this application are construed as a limitation as follows.

In-vehicle control unit: It refers to a control unit disposed or installed on a vehicle, and includes various communications devices, for example, an engine control unit (ECU), a zone gateway, a domain gateway, a central gateway, a domain control unit (DCU), a multi-domain controller (MDC), and an automatic driving network element.

Heat exchange unit: an apparatus used for heat exchange of temperature control fluid, for example, may be a water tank with an air-cooled structure, a water tank with an air-cooled structure and a heating system, or an air-conditioning box with refrigeration and heating functions.

Temperature control fluid: the fluid that circulates in a flow path of a temperature control system to transfer heat, such as water, glycol-aqueous solution, or a mixture of water, antifreeze, and additives.

Temperature sensor module: a module for sensing a temperature, for example, a temperature sensor.

Temperature control unit: a unit for controlling a temperature, including a processor.

Flow control valve: It receives external signal control, and regulates a valve opening degree, to adjust a flow rate or realize functions of opening, switching, and closing a flow rate.

Battery unit: an in-vehicle battery, which may be a battery group of an electric vehicle or a battery of a fuel vehicle.

Control board: a circuit board including a controller.

Temperature control plate: a panel structure that is used to conduct a temperature and to be attached to an in-vehicle control unit or battery unit to perform temperature control on the in-vehicle control unit or battery unit.

Heat transfer plate: a panel structure that is used to conduct a temperature.

Embodiment 1 of this application provides a vehicle temperature control system, configured to perform temperature control for an in-vehicle control unit and a battery unit at the same time. With reference to FIG. 1, the following describes a technical solution in Embodiment 1 provided in this application.

Figure 1B:
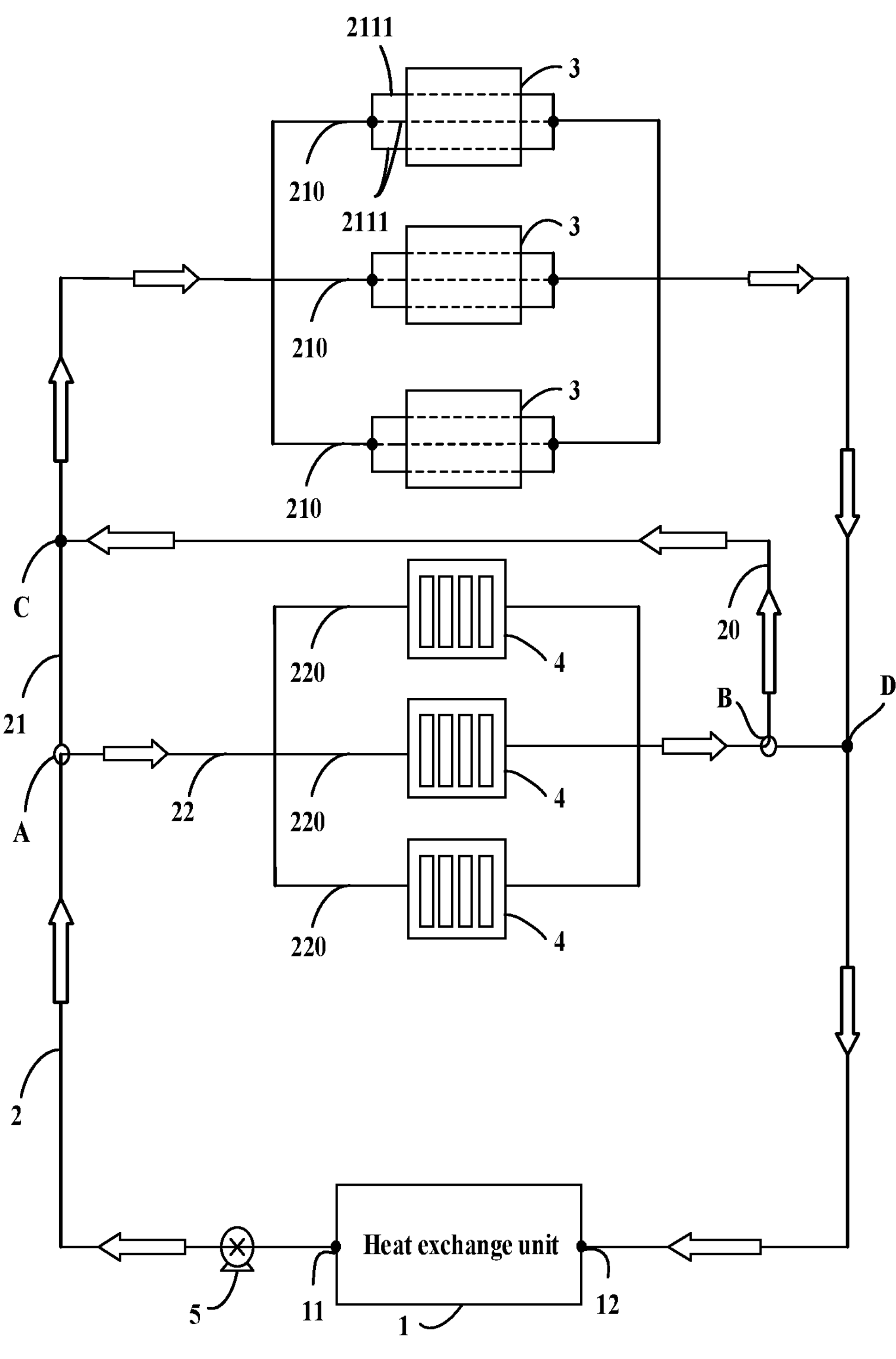
FIG. 1B is a schematic diagram of a series flow path of a vehicle temperature control system according to Embodiment 1 of this application.

FIG. 1A and FIG. 1B are two different temperature control flow paths provided by the vehicle temperature control system according to Embodiment 1 of this application.

According to Embodiment 1 of this application, the vehicle temperature control system includes a heat exchange unit 1, a temperature control backbone pipe 2, a plurality of in-vehicle control units 3, and a plurality of battery units 4. Temperature control fluid circulates in the heat exchange unit 1, the temperature control backbone pipe 2, the in-vehicle control units 3, and the battery units 4. The temperature control fluid flows into the temperature control backbone pipe 2 from the heat exchange unit 1, and then flows through the in-vehicle control units 3 and the battery units 4 separately. As a way to control a temperature, the temperature control fluid separately performs heat exchange with the in-vehicle control units 3 and the battery units 4. After heat exchange, the temperature control fluid after being heated up or cooled down is returned to the heat exchange unit 1 through the temperature control backbone pipe 2, and the heat exchange unit 1 performs heat exchange on the temperature control fluid to cool the temperature control fluid down or heat the temperature control fluid up. The foregoing circulation process of the temperature control fluid is repeated.

The heat exchange unit 1 includes an output port 11 and a backflow port 12. The temperature control fluid after being cooled down or heated up in the heat exchange unit 1 flows from the output port 11 to the temperature control backbone pipe 2, where a circulating pump 5 is installed on the temperature control backbone pipe 2, and the circulating pump 5 pumps the temperature control fluid to circulate in the system flow path. The temperature control backbone pipe 2 has two flow path branches, which are respectively an in-vehicle control unit temperature control flow path 21 and a battery temperature control flow path 22. The plurality of in-vehicle control units 3 are connected in parallel on the in-vehicle control unit temperature control flow path 21, and the plurality of battery units 4 are connected in parallel on the battery temperature control flow path 22.

A plurality of control unit temperature control branches 210 are disposed on the in-vehicle control unit temperature control flow path 21, each control unit temperature control branch 210 corresponds to one in-vehicle control unit 3, and the plurality of in-vehicle control units 3 are distributed in parallel with each other. At least one temperature control branch 2111 communicates with the control unit temperature control branch 210, and the temperature control fluid in the temperature control branch 2111 performs heat exchange with the in-vehicle control unit 3. The temperature control branch 2111 is disposed adjacent to the in-vehicle control unit 3, and at least one temperature control branch 2111 passes through the inside of the in-vehicle control unit 3. After performing heat exchange with the in-vehicle control unit 3, the temperature control fluid in the temperature control branch 2111 converges on a downstream part of the control unit temperature control branch 210. After performing heat exchange with the in-vehicle control units 3, the temperature control fluid in the plurality of control unit temperature control branches 210 converges on a downstream part of the temperature control backbone pipe 2, and finally flows back to the heat exchange unit 1 through the backflow port 12. It may be understood that if there is only one in-vehicle control unit 3, there may be only one control unit temperature control branch 210 correspondingly. A quantity of the in-vehicle control units 3 is not limited in this application. A plurality of battery unit temperature control branches 220 are disposed on the battery temperature control flow path 22, each battery unit temperature control branch 220 corresponds to one battery unit 4, and the temperature control fluid in the battery unit temperature control branch 220 flows through the vicinity of the battery unit 4 to perform heat exchange with the battery unit 4. After performing heat exchange with the battery units 4, the temperature control fluid in the plurality of battery unit temperature control branches 220 converges on the downstream part of the temperature control backbone pipe 2, and finally flows back to the heat exchange unit 1 through the backflow port 12. The plurality of battery units 4 as a whole constitute a battery group or a battery of a vehicle. It may be understood that if there is only one battery unit 4, there may be only one battery unit temperature control branch 220 correspondingly. A quantity of the battery units 4 is not limited in this application. It may be understood that at least one temperature control branch may communicate with the battery unit temperature control branch 220, and the temperature control fluid in the temperature control branch performs heat exchange with the battery unit 4. This is not limited in this application.

A control valve A is disposed at a branch node of an upstream part of the temperature control backbone pipe 2, and the control valve A is a three-way valve structure capable of controlling an outlet direction, including one inlet and two outlets. The inlet of the control valve A is connected to the upstream part of the temperature control backbone pipe 2. The two outlets of the control valve A are respectively connected to the two flow path branches: the in-vehicle control unit temperature control flow path 21 and the battery temperature control flow path 22. For example, one outlet of the control valve A leads to an inlet of a three-way valve C, through an outlet of which the in-vehicle control unit temperature control flow path 21 is reached, and the other outlet of the control valve A leads to the battery temperature control flow path 22. The control valve A can control opening and closing of the two outlets, thereby controlling a flow direction of a flow path of the temperature control fluid. A three-way valve D is disposed at a branch node of the downstream part of the temperature control backbone pipe 2, and the three-way valve D includes two inlets and one outlet, configured to connect downstream parts of the in-vehicle control unit temperature control flow path 21 and the battery temperature control flow path 22 to the downstream part of the temperature control backbone pipe 2. It may be understood that the three-way valve D mentioned in this application is merely an example, and any apparatus that can implement a same function may be applied to this application.

A control valve B is disposed at the downstream part of the battery temperature control flow path 22, and the control valve B is also a three-way valve structure capable of controlling an outlet direction, including one inlet and two outlets. The control valve B controls the flow direction of the flow path of the temperature control fluid by controlling opening and closing of the two outlets. The downstream part of the battery temperature control flow path 22 flows in from the inlet of the control valve B and flows out from the outlet of the control valve B. Specifically, the temperature control fluid in the battery temperature control flow path 22 may flow through one outlet of the control valve B to one inlet of the three-way valve D, or may flow through the other outlet to one inlet of the three-way valve C through a bridge pipe 20.

The three-way valve C is disposed at an upstream part of the in-vehicle control unit temperature control flow path 21, and the three-way valve C includes two inlets and one outlet. As described above, one inlet of the three-way valve C communicates with one outlet of the control valve A, and the other inlet of the three-way valve C communicates with the bridge pipe 20.

In the vehicle temperature control system provided in Embodiment 1, when both the outlets of the control valve A are in open state, the outlet of the control valve B leading to the bridge pipe 20 is in closed state, and the outlet of the control valve B leading to the three-way valve D is in open state, parallel flow paths of the vehicle temperature control system are realized, as shown in FIG. 1A. According to the parallel flow paths, the in-vehicle control unit temperature control flow path 21 and the battery temperature control flow path 22 are connected in parallel and are controlled in temperature independently.

In the vehicle temperature control system provided in Embodiment 1, when the outlet of the control valve A leading to the in-vehicle control unit temperature control flow path 21 is in closed state, the outlet of the control valve A leading to the battery temperature control flow path 22 is in open state, the outlet of the control valve B leading to the three-way valve D is in closed state, and the outlet of the control valve B leading to the bridge pipe 20 is in open state, a series flow path of the vehicle temperature control system is realized, as shown in FIG. 1B. Based on the series flow path, the parallel battery temperature control flow path 22 and the in-vehicle control unit temperature control flow path 21 are connected in series, and the temperature control fluid flows through the battery units 4 and the in-vehicle control units 3 successively for temperature control.

It may be understood that the temperature control fluid is coolant when the vehicle temperature control system is for cooling. The temperature control fluid in the heat exchange unit 1 is coolant. The coolant flows from the output port 11 of the heat exchange unit 1 to the temperature control backbone pipe 2, to perform heat exchange with the battery units 4 and the in-vehicle control units 3. After a temperature of the coolant increases, the coolant flows back to the heat exchange unit 1 through the backflow port 12, and then the heat exchange unit cools the coolant down. The same circulation process repeats. On the contrary, when the vehicle temperature control system is for heating, the temperature control fluid is thermal fluid. The heat exchange unit 1 heats the temperature control fluid up and the temperature control fluid flows in the vehicle temperature control system based on the circulation process mentioned earlier.

Further, it can be understood that, in the vehicle temperature control system provided in Embodiment 1, positions arranged for the battery units 4 and the in-vehicle control units 3 can be changed, so that the temperature control fluid can first flow through the in-vehicle control units 3 and then flow through the battery units 4 in the series flow path. In this way, a more significant temperature control effect on the in-vehicle control units 3 than the battery units 4 is realized.

Embodiment 2 of this application provides another vehicle temperature control system, configured to perform temperature control for an in-vehicle control unit and a battery unit at the same time. Different from Embodiment 1, in the vehicle temperature control system of Embodiment 2, when there are a plurality of in-vehicle control units 3, the plurality of in-vehicle control units 3 are distributed in series.

When temperature control is performed on the plurality of in-vehicle control units 3, temperature control fluid is shunted to a plurality of temperature control branches 2111 from an in-vehicle control unit temperature control flow path 21, the temperature control fluid in the temperature control branches 2111 performs heat exchange with the in-vehicle control units 3, the plurality of temperature control branches 2111 are disposed adjacent to the in-vehicle control units 3, and at least one temperature control branch 2111 passes through the inside of the in-vehicle control units 3. After performing heat exchange with the in-vehicle control unit 3, the temperature control fluid in the temperature control branch 2111 converges on a control unit temperature control branch 210. The temperature control fluid is then shunted to a plurality of temperature control branches 2111, and temperature control is performed on another in-vehicle control unit 3. After the temperature control fluid flows through the last one of the in-vehicle control units 3 connected in series, the temperature control fluid converges on a downstream part of the control unit temperature control branch 210. Then, the temperature control fluid, together with that of a battery unit temperature control branch 220, converges on a downstream part of a temperature control backbone pipe 2, and finally flows back to a heat exchange unit 1 through a backflow port 12.

Figure 2A:
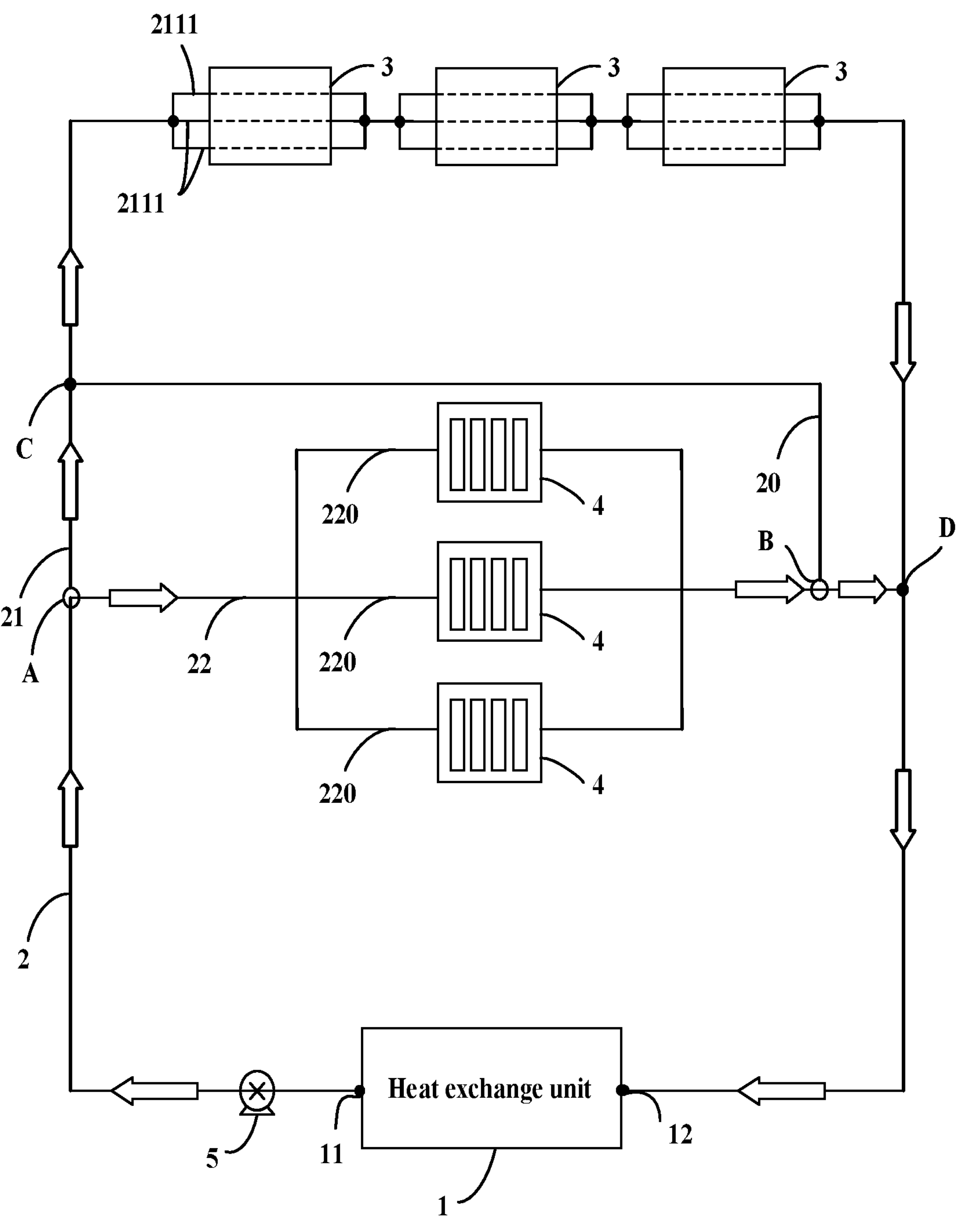
FIG. 2A is a schematic diagram of parallel flow paths of a vehicle temperature control system according to Embodiment 2 of this application.

In the vehicle temperature control system provided in Embodiment 2, when both outlets of a control valve A are in open state, an outlet of a control valve B leading to a bridge pipe 20 is in closed state, and an outlet of the control valve B leading to a three-way valve D is in open state, parallel flow paths of the vehicle temperature control system are realized, as shown in FIG. 2A. According to the parallel flow paths, the in-vehicle control unit temperature control flow path 21 and a battery temperature control flow path 22 are connected in parallel and are controlled in temperature independently.

Figure 2B:
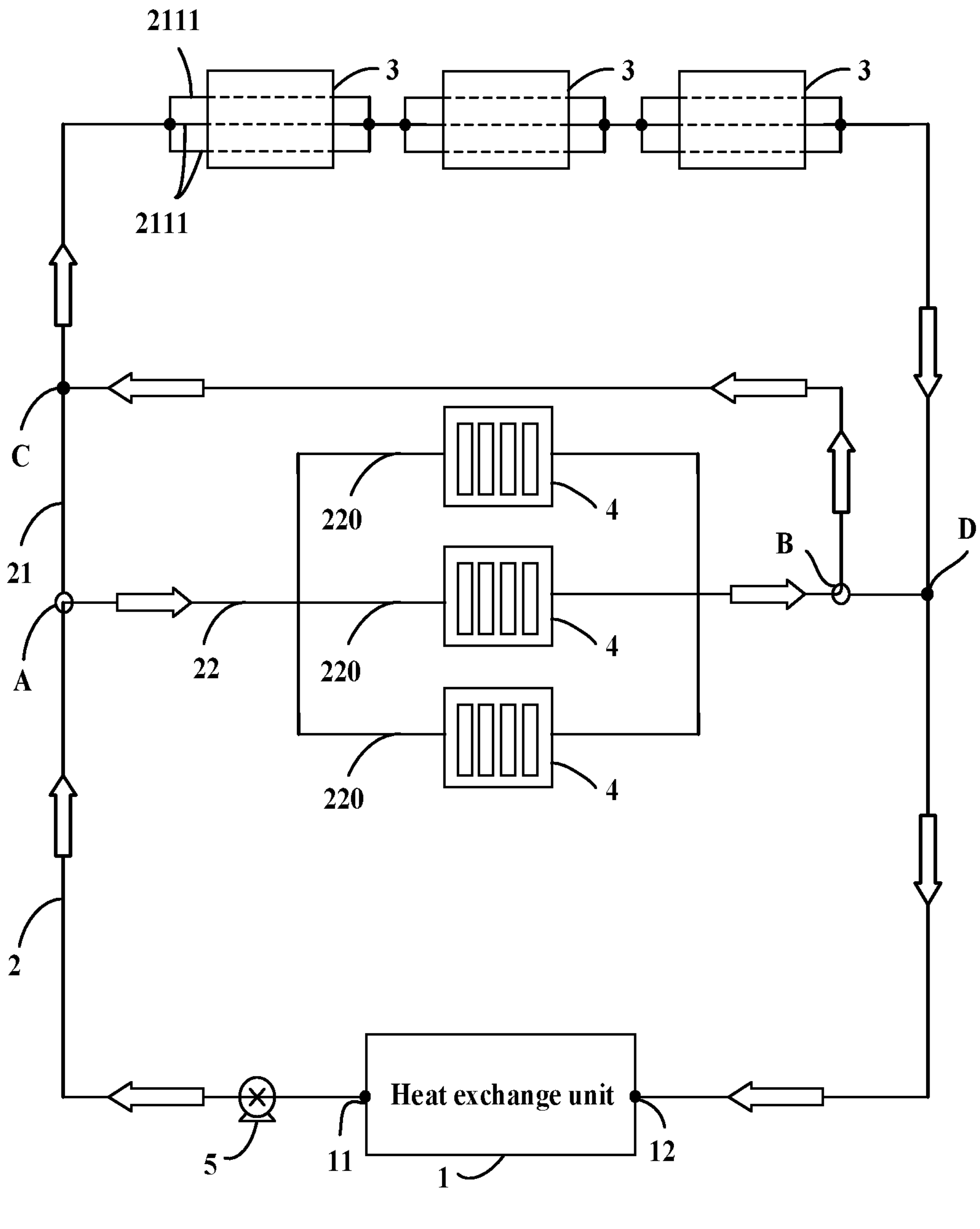
FIG. 2B is a schematic diagram of a series flow path of a vehicle temperature control system according to Embodiment 2 of this application.

In the vehicle temperature control system provided in Embodiment 2, when the outlet of the control valve A leading to the in-vehicle control unit temperature control flow path 21 is in closed state, the outlet of the control valve A leading to the battery temperature control flow path 22 is in open state, the outlet of the control valve B leading to the three-way valve D is in closed state, and the outlet of the control valve B leading to the bridge pipe 20 is in open state, a series flow path of the vehicle temperature control system is realized, as shown in FIG. 2B. Based on the series flow path, the battery temperature control flow path 22 and the in-vehicle control unit temperature control flow path 21 are connected in series, and the temperature control fluid flows through battery units 4 and the in-vehicle control units 3 successively for temperature control.

Figure 3:
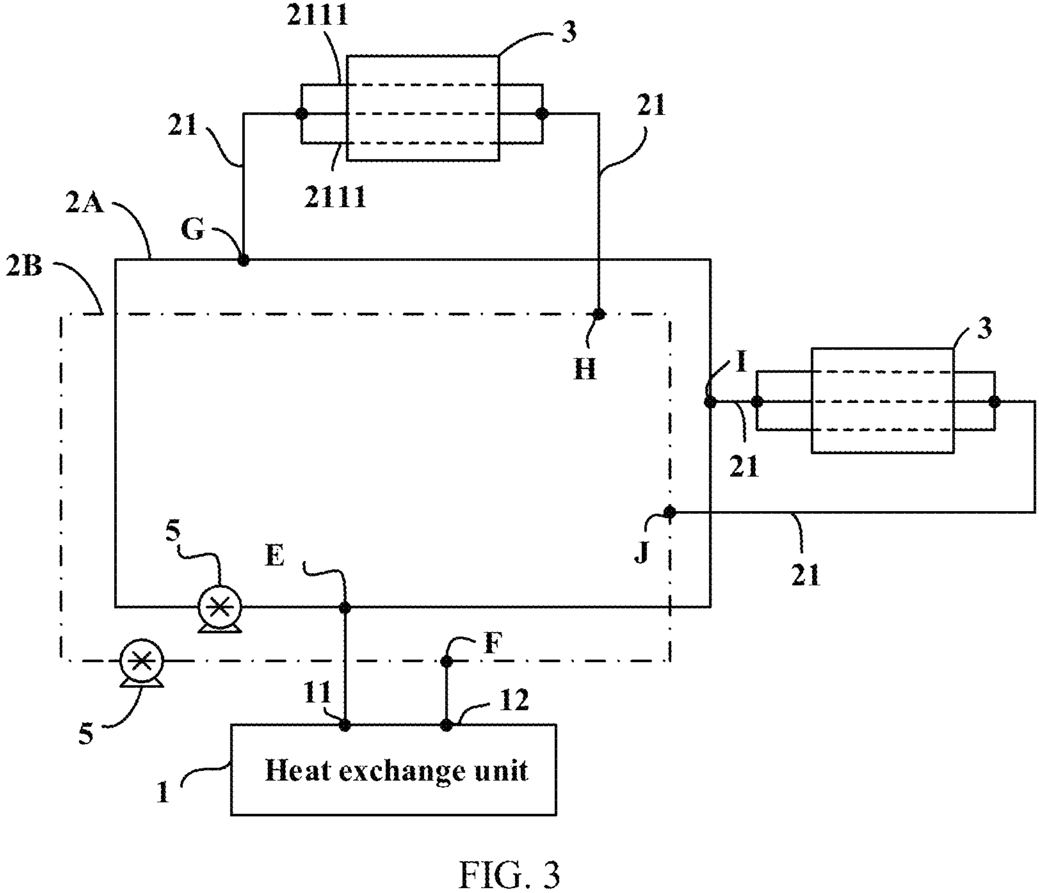
FIG. 3 is a schematic diagram of a structure of a vehicle temperature control system according to Embodiment 3 of this application.

FIG. 3 is a schematic diagram of a structure of a vehicle temperature control system according to Embodiment 3 of this application.

The vehicle temperature control system provided in Embodiment 3 includes two main temperature control pipes. In this technical solution, the two main temperature control pipes are two annular flow paths, including an upstream main pipe 2A and a downstream main pipe 2B, and a circulating pump 5 is installed on both of the main pipes 2A and 2B, and configured to apply a force of flowing to temperature control fluid.

An output port 11 of a heat exchange unit 1 is connected to a three-way valve E on the upstream main pipe 2A. Three-way valves G and I on the upstream main pipe 2A are respectively connected to inflow ends of an in-vehicle control unit temperature control flow path 21. Outflow ports of the in-vehicle control unit temperature control flow path 21 are connected to three-way valves H and J on the downstream main pipe 2B. A three-way valve F on the downstream main pipe 2B communicates with a backflow port 12 of the heat exchange unit 1. It may be understood that, in this embodiment of this application, a quantity of in-vehicle control units is not limited.

In Embodiment 3, an example in which the vehicle temperature control system is for cooling is used, and a working process of the vehicle temperature control system is as follows. The temperature control fluid in the heat exchange unit 1 is coolant. The coolant flows out from the output port 11 of the heat exchange unit 1, and flows into the upstream main pipe 2A through the three-way valve E. Then the coolant in the upstream main pipe 2A flows into each temperature control flow path 21 from the three-way valves G and I separately. The coolant in the temperature control flow path 21 is shunted into a plurality of temperature control branches 2111, where at least one of the temperature control branches 2111 passes through the inside of an in-vehicle control unit 3. The coolant performs heat exchange with the in-vehicle control unit 3 in the temperature control branch 2111, thereby cooling the in-vehicle control unit 3 down. Next, the coolant flows from the plurality of temperature control branches 2111 to a latter half part of the temperature control flow path 21, and flows into the downstream main pipe 2B through the three-way valves H and J. The coolant in the downstream main pipe 2B flows to the backflow port 12 of the heat exchange unit 1 through the three-way valve F, and flows back to the heat exchange unit 1. In the heat exchange unit 1, the coolant is cooled down and then flows out from the output port 11 of the heat exchange unit 1. The same circulation process repeats.

It can be understood that, in the vehicle temperature control system provided in Embodiment 3, the circulating pump 5 on the upstream main pipe 2A may be disposed at a position between the output port 11 and the three-way valve E, and the circulating pump 5 continuously pumps the temperature control fluid flowing out of the output port 11 into the upstream main pipe 2A. In addition, the circulating pump 5 on the downstream main pipe 2B may be disposed at a position between the three-way valve F and the backflow port 12, and the circulating pump 5 continuously pumps the temperature control fluid in the downstream main pipe 2B into the backflow port 12.

It can further be understood that the circulating pump 5 is not necessarily provided, and a pumping apparatus or a backflow apparatus may be installed inside the heat exchange unit 1 so that there is a pressure difference between the temperature control fluid output from the output port 11 and the temperature control fluid flowing back from the backflow port 12.

For the vehicle temperature control system provided in Embodiment 3, the temperature control flow path 21 of the in-vehicle control unit 3 is connected between the upstream main pipe 2A and the downstream main pipe 2B by disposing the upstream main pipe 2A and the downstream main pipe 2B, which facilitates cooperative temperature control of in-vehicle control units 3 distributed at different positions of a vehicle. Even if a space distance between the in-vehicle control units 3 is relatively long, temperature control for a plurality of in-vehicle control units 3 can be performed independently by using the temperature control system, which simplifies an arrangement and improves operability of temperature control for the in-vehicle control units in the vehicle.

Figure 4:
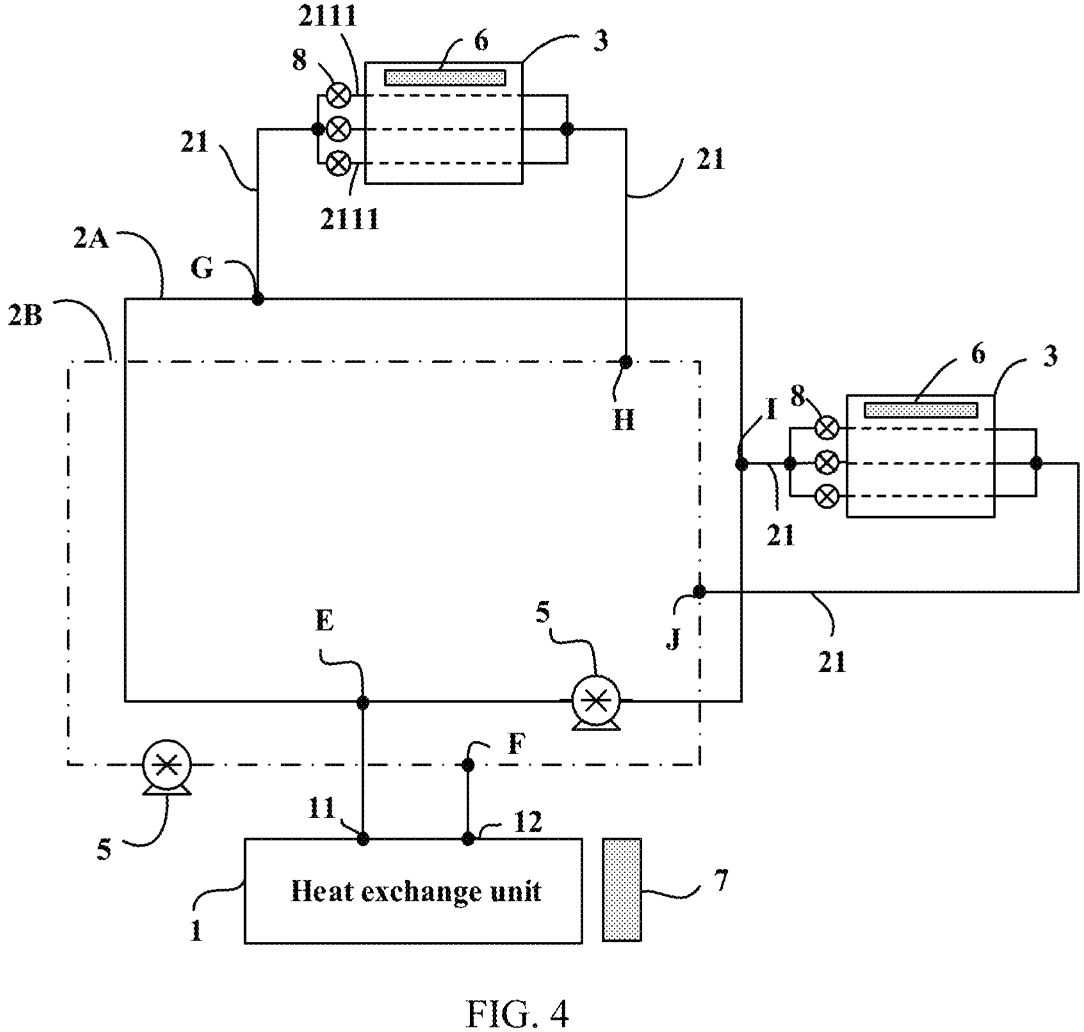
FIG. 4 is a schematic diagram of a structure of a vehicle temperature control system according to Embodiment 4 of this application.

Based on Embodiment 3, to improve control precision and control efficiency of the temperature control system, a control function is added to the vehicle temperature control system in this application, to form Embodiment 4. A schematic diagram of a structure of Embodiment 4 is shown in FIG. 4.

In a vehicle temperature control system provided in Embodiment 4, a flow control valve 8 is installed on each temperature control branch 2111, and the flow control valve 8 is used to regulate a flow rate of temperature control fluid flowing through the temperature control branch 2111. A temperature sensor module 6 is installed near an in-vehicle control unit 3 (the temperature sensor module 6 may alternatively be integrated on the in-vehicle control unit 3). The temperature sensor module 6 is configured to monitor a temperature of the in-vehicle control unit 3, and transmit temperature information to a temperature control unit 7 in a wired or wireless manner. The temperature control unit 7 is disposed near a heat exchange unit 1, or is mounted or integrated on a heat exchange unit 1. The temperature control unit 7 controls the flow control valve 8 based on a collected temperature signal of the temperature sensor module 6. During working, the temperature control unit 7 first calculates a difference value based on a target temperature value and an actual temperature value measured by the temperature sensor module 6 that are of the in-vehicle control unit 3. When the difference value is relatively large, the flow control valve 8 is controlled to open at a relatively large opening degree, to increase the flow rate of the fluid in the temperature control branch 2111. When the difference value between the target temperature value and the actual temperature value measured by the temperature sensor module 6 that are of the in-vehicle control unit 3 is relatively small, the temperature control unit 7 controls the flow control valve 8 to open at a relatively small opening degree, to reduce the flow rate of the fluid in the temperature control branch 2111.

Figure 5:
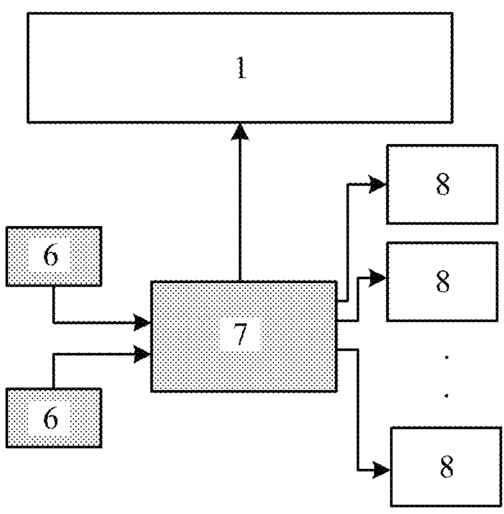
FIG. 5 is a schematic diagram of a control relationship of a vehicle temperature control system according to Embodiment 4 of this application.

FIG. 5 is a schematic diagram of a control relationship according to Embodiment 4, which describes a working principle of the temperature control unit 7. A signal input end of the temperature control unit 7 is connected to (one or more) temperature sensor modules 6, and a signal output end of the temperature control unit 7 is connected to the heat exchange unit 1 and one or more flow control valves 8.

For example, when the temperature control system performs cooling processing on the in-vehicle control unit, the difference value=the actual temperature value−the target temperature value, and the temperature control unit 7 controls the flow control valve 8 based on a corresponding relationship in Table 1.

TABLE 1

Examples of a control relationship between the flow control valve and a temperature

| Temperature difference value range | Flow control valve gear | Opening degree of the flow control valve |
|---|---|---|
| Difference value ≥ 10 degrees | A | 100% |
| 5 degrees ≤ difference value < 10 degrees | B | 75% |
| 0 degrees ≤ difference value < 5 degrees | C | 50% |
| Difference value < 0 degrees | D | 25% |

For example, when a vehicle runs in hot summer, the temperature control system needs to perform cooling processing on the in-vehicle control unit 3, and the temperature control unit 7 sets the target temperature value of the in-vehicle control unit 3 to 20 degrees Celsius in advance. When the actual temperature value measured by the temperature sensor module 6 is 40 degrees Celsius, the difference value after the actual temperature value minus the target temperature value is equal to 20 degrees. Based on the control relationship in Table 1, the flow control valve 8 is at gear A in this case. Therefore, the temperature control unit 7 controls the flow control valve 8 to keep opening at a 100% opening degree, so that the flow rate of the fluid in the temperature control branch 2111 is maximized. When the actual temperature value measured by the temperature sensor module 6 is 24 degrees Celsius, the difference value after the actual temperature value minus the target temperature value is equal to 4 degrees. Based on the control relationship in Table 1, the flow control valve 8 is at gear C in this case. Therefore, the temperature control unit 7 controls the flow control valve 8 to keep opening at a 50% opening degree, to reduce the flow rate of the fluid in the temperature control branch 2111. It may be understood that the corresponding relationship among the temperature difference range threshold, the flow control valve gear, and the opening degree of the flow control valve 8 in Table 1 is only an example. During actual application, corresponding adjustment may be performed based on different requirements. This is not limited in this application.

For example, when the temperature control system performs heating processing on the in-vehicle control unit, the difference value=the target temperature value−the actual temperature value, and the temperature control unit 7 controls the flow control valve 8 based on a corresponding relationship in Table 1 in the same way.

For example, when a vehicle runs in a cold environment, the temperature control system needs to perform heating processing on the in-vehicle control unit 3, and the temperature control unit 7 sets the target temperature value of the in-vehicle control unit 3 to 20 degrees Celsius in advance. When the actual temperature value measured by the temperature sensor module 6 is −5 degrees Celsius, the difference value is equal to 25 degrees. Based on the control relationship in Table 1, the flow control valve 8 is at gear A in this case. Therefore, the temperature control unit 7 controls the flow control valve 8 to keep opening at a 100% opening degree, so that the flow rate of the fluid in the temperature control branch 2111 is maximized. When the actual temperature value measured by the temperature sensor module 6 is 30 degrees Celsius, the difference value is equal to −5 degrees. Based on the control relationship in Table 1, the flow control valve 8 is at gear D in this case. Therefore, the temperature control unit 7 controls the flow control valve 8 to keep opening at a 25% opening degree, to minimize the flow rate of the fluid in the temperature control branch 2111.

In addition, based on the temperature information collected by the temperature sensor module 6 and the temperature difference value (when the temperature control system performs cooling processing on the in-vehicle control unit 3, the difference value=the actual temperature value−the target temperature value, and when the temperature control system performs heating processing on the in-vehicle control unit 3, the difference value=the target temperature value−the actual temperature value), the temperature control unit 7 may further control a power of the heat exchange unit 1. For example, the temperature control unit 7 controls the power of the heat exchange unit 1 with reference to a corresponding relationship in Table 2.

TABLE 2

Control relationships between the heat exchange unit and a temperature

| Temperature difference value range | Heat exchange unit gear | Power value of the heat exchange unit |
|---|---|---|
| Difference value ≥ 10 degrees | A | 100% |
| 5 degrees ≤ difference value < 10 degrees | B | 75% |
| 0 degrees ≤ difference value < 5 degrees | C | 50% |
| Difference value < 0 degrees | D | 25% |

Specifically, when the temperature difference value is equal to or higher than 10 degrees, the temperature control unit 7 controls the heat exchange unit 1 to work at gear A, and a power of the heat exchange unit 1 corresponding to gear A is 100%, thereby improving working efficiency of the heat exchange unit 1 and improving a temperature control effect. Correspondingly, when the difference value is less than 10 degrees, the temperature control unit 7 controls the heat exchange unit 1 to work at gear B, C, or D corresponding to the difference value.

Figure 6:
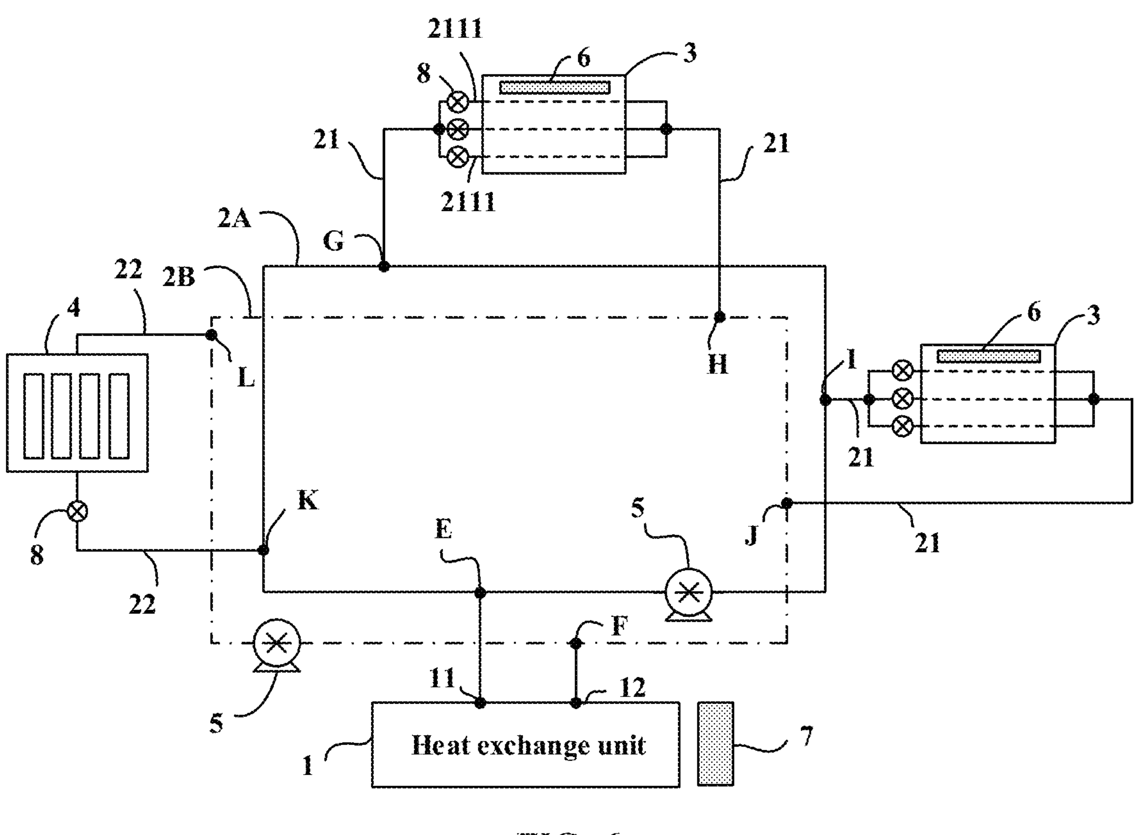
FIG. 6 is a schematic diagram of a structure of a vehicle temperature control system according to Embodiment 5 of this application.

FIG. 6 is a schematic diagram of a structure of a vehicle temperature control system according to Embodiment 5 of this application. In Embodiment 5, temperature control on a battery unit 4 is added based on the technical solution provided in Embodiment 4.

According to the technical solution provided in Embodiment 5, an upstream main pipe 2A communicates with a battery temperature control flow path 22 at a three-way valve K, a flow control valve 8 is installed on the battery temperature control flow path 22, a path of the battery temperature control flow path 22 is adjacent to or passes through the battery unit 4, and temperature control fluid flowing through the battery temperature control flow path 22 performs heat exchange with the battery unit 4, thereby implementing temperature control for the battery unit 4. After passing through the battery unit 4, the battery temperature control flow path 22 is connected to a downstream main pipe 2B at a three-way valve L. The vehicle temperature control system may perform temperature regulation for a plurality of battery units 4, where each battery unit 4 corresponds to one battery temperature control flow path 22, or the plurality of battery units 4 as a whole correspond to one battery temperature control flow path 22, and the plurality of battery units 4 form a parallel connection.

When an in-vehicle control unit 3 is disposed, the in-vehicle control unit 3 may be disposed at a periphery of or on the battery unit 4, thereby reducing space occupied by an electrical device and making for a compact overall structure. In addition, the in-vehicle control unit and battery unit can be installed in a more reliable manner, and a probability of a failure caused by long-term vibration is reduced. In addition, the arrangement manner also facilitates an arrangement of the temperature control flow path, reduces a length of the temperature control flow path, and improves stability of the temperature control system.

It should be noted that the three-way valves C, D, E, F, G, H, I, J, K, and L mentioned in the foregoing implementations are merely examples, which certainly can be other types of pipe connectors.

FIG. 7 to FIG. 10 respectively provide internal structural diagrams of four in-vehicle control units 3.

Figures 7, 8, 9:
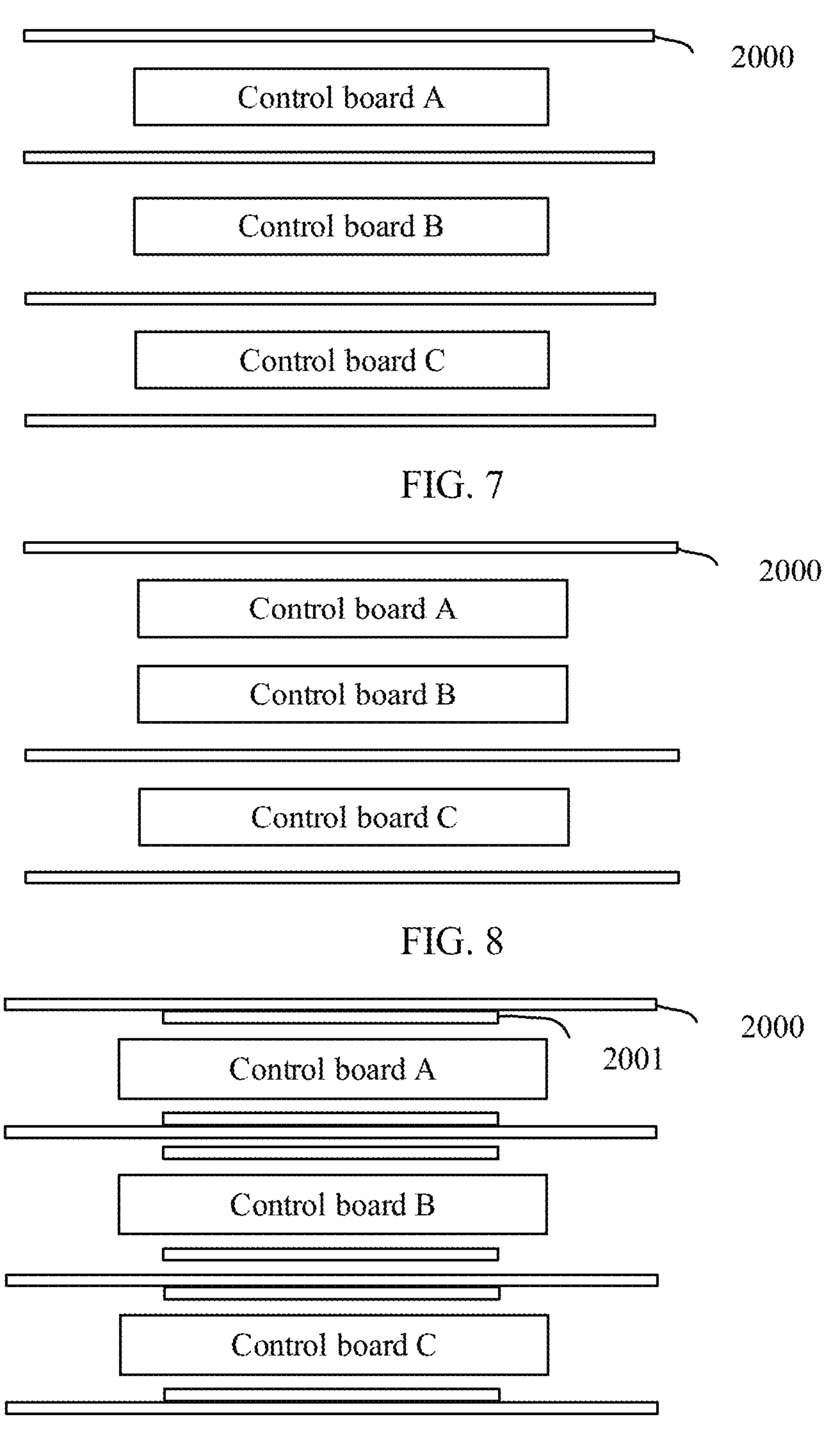

In schematic diagrams of structures of in-vehicle control units 3 provided in FIG. 7 and FIG. 8, the in-vehicle control units 3 include one or more control boards disposed side by side, and a temperature control plate 2000 is distributed on one side or both sides of each control board.

In FIG. 7, an example in which three control boards A, B, and C are disposed side by side is used. Two temperature control plates 2000 are disposed outside two outer control boards (the control board A and the control board C), and the other two temperature control plates 2000 are inserted among the three control boards, that is, the control boards and the temperature control plates are disposed alternately. A temperature control branch 2111 is disposed inside the temperature control plate 2000, and temperature control fluid flows through the inside of the temperature control plate 2000 to perform heat exchange with the control boards A, B, and C, thereby implementing temperature regulation for the control boards A, B, and C. The arrangement structure facilitates fast temperature control for a plurality of control boards.

In FIG. 8, the example in which three control boards A, B, and C are disposed side by side is also used. Two temperature control plates 2000 are disposed outside two outer control boards (the control board A and the control board C), and one temperature control plate 2000 is inserted at a position among the three control boards. A temperature control branch 2111 is disposed inside the temperature control plate 2000, and temperature control fluid flows through the inside of the temperature control plate 2000 to perform heat exchange with the control boards A, B, and C, thereby implementing temperature regulation for the control boards A, B, and C. The arrangement structure can reduce use of the temperature control plates, improve temperature control efficiency of the temperature control plates, and facilitate temperature control of a plurality of control boards.

Respectively based on FIG. 7 and FIG. 8 in which the temperature control plate 2000 is distributed on one side or both sides of each control board, in schematic diagrams of structures of in-vehicle control units 3 shown in FIG. 9 and FIG. 10, a heat transfer plate 2001 is further disposed on one side or both sides of a control board, where the heat transfer plate 2001 is distributed between the control board and the temperature control plate 2000. By disposing the heat transfer plate, heat exchange efficiency between the in-vehicle control unit and the temperature control plate is improved, and a temperature control effect is improved.

Further, to improve heat transfer efficiency between the heat transfer plate 2001 and the temperature control plate 2000, a contact area between the heat transfer plate 2001 and the temperature control plate 2000 may be increased. For example, a contact part of the heat transfer plate 2001 and the temperature control plate 2000 is designed to be a wavy shape with convex and concave designs.

In FIG. 9, an example in which three control boards A, B, and C are disposed side by side is used. Two temperature control plates 2000 are disposed outside two outer control boards (the control board A and the control board C), and the other two temperature control plates 2000 are inserted among the three control boards. A heat transfer plate 2001 is disposed between a control board and a temperature control plate 2000 to improve temperature transfer efficiency. A temperature control branch 2111 is disposed inside the temperature control plate 2000, and temperature control fluid flows through the inside of the temperature control plate 2000 to perform heat exchange with the control boards A, B, and C by using a plurality of heat transfer plates 2001, thereby implementing temperature regulation for the control boards A, B, and C.

In FIG. 10, the example in which three control boards A, B, and C are disposed side by side is also used. Two temperature control plates 2000 are disposed outside two outer control boards (the control board A and the control board C), and one temperature control plate 2000 is inserted at a position among the three control boards. A heat transfer plate 2001 is disposed between a control board and a temperature control plate 2000 to improve temperature transfer efficiency. A temperature control branch 2111 is disposed inside the temperature control plate 2000, and temperature control fluid flows through the inside of the temperature control plate 2000 to perform heat exchange with the control boards A, B, and C by using a plurality of heat transfer plates 2001, thereby implementing temperature regulation for the control boards A, B, and C.

FIG. 11 discloses an internal structure of a temperature control plate 2000. A guide channel 2112 is disposed inside the temperature control plate 2000, and the guide channel 2112 is arranged in a wavy shape in the temperature control plate 2000, to allow a larger volume of temperature control fluid to flow through, thereby improving heat exchange efficiency. A temperature control branch 2111 located outside the temperature control plate 2000 communicates with the guide channel 2112 inside the temperature control plate 2000. Two entrances communicating the temperature control plate 2000 with the temperature control branch 2111 may be disposed on the two sides shown in FIG. 11, or may be disposed on a same side adjacent to each other. Specific positions of the two entrances are designed flexibly based on an orientation of an in-vehicle control unit and a flow path arrangement of a temperature control system.

FIG. 12 discloses another internal structure of a temperature control plate 2000. A guide channel 2112 and a liquid storage chamber 2113 are disposed inside the temperature control plate 2000. The liquid storage chamber 2113 is a hollow chamber inside the temperature control plate 2000, and two sides of the liquid storage chamber 2113 separately communicate with the guide channel 2112. A temperature control branch 2111 located outside the temperature control plate 2000 communicates with the guide channel 2112 inside the temperature control plate 2000. During working of a temperature control system, temperature control fluid flows into the liquid storage chamber 2113 from the temperature control branch 2111 through the guide channel 2112. The temperature control fluid in the liquid storage chamber 2113 performs heat exchange with an in-vehicle control unit, and then flows out from the guide channel 2112 on the other side to a downstream temperature control branch 2111.

In another embodiment of this application, an electromagnetic shielding material is covered on a periphery of an in-vehicle control unit 3, to prevent electromagnetic interference from another in-vehicle electronic device and an external environment, and ensure stability of communication transmission of the in-vehicle control unit 3. In this case, at least a part of the temperature control branch 2111 is disposed inside the electromagnetic shielding material, that is, the electromagnetic shielding material partially covers the temperature control branch 2111. In this arrangement manner, electromagnetic interference prevention can be realized for the in-vehicle control unit 3, and an arrangement of a temperature control path can be facilitated.

The in-vehicle control unit in this application includes all control components used in a vehicle to implement various control functions, and also includes various communications devices installed or integrated in the vehicle, such as an ECU, a zone gateway, a domain gateway, a central gateway, a DCU, an MDC, and an automatic driving network element.

Same or similar parts between the embodiments described above may be cross-referenced.

The foregoing descriptions are merely some specific embodiments of this application, but the protection scope of this application is not limited thereto.

What is claimed is:

1. A vehicle temperature control system, comprising:

an in-vehicle control unit comprising at least one control board, wherein a temperature control plate is attached to the at least one control board, wherein a guide channel is arranged in a wavy shape inside the temperature control plate, and wherein a heat transfer plate is disposed between the at least one control board and the temperature control plate;

an in-vehicle control unit temperature control flow path coupled to the in-vehicle control unit and configured to perform a first temperature control for the in-vehicle control unit, wherein the in-vehicle control unit temperature control flow path comprises a plurality of temperature control branches to perform the first temperature control on the in-vehicle control unit, and wherein at least one the temperature control branches passes through the in-vehicle control unit;

a plurality of battery units;

a battery temperature control flow path coupled to the battery units and configured to perform a second temperature control for the battery units, wherein the battery temperature control flow path comprises a plurality of battery unit temperature control branches to respectively perform the second temperature control on the battery units, and wherein each of the battery unit temperature control branches corresponds to one of the battery units;

a heat exchange unit comprising an output port and a backflow port, and configured to provide temperature control fluid for the in-vehicle control unit temperature control flow path and the battery temperature control flow path;

a temperature sensor control unit configured to control a flow speed or flow rate of the temperature control fluid based on a collected temperature signal; and a control valve unit configured to control the in-vehicle control unit temperature control flow path and the battery temperature control flow path to be connected in parallel, and comprising a first three-way control valve disposed at a joint between upstream flow paths of the in-vehicle control unit temperature control flow path and the battery temperature control flow path, and comprising a first inlet coupled to a temperature control backbone pipe, a first outlet, and a second outlet, wherein the first outlet and the second outlet are connected respectively to the in-vehicle control unit temperature control flow path and the battery temperature control flow path; and a second three-way control valve disposed on a downstream flow path of the in-vehicle control unit temperature control flow path or the battery temperature control flow path, and comprising a second inlet connected to the battery temperature control flow path, a third outlet connected to a downstream three-way valve, and a fourth outlet connected via a bridge pipe to the in-vehicle control unit temperature control flow path.

2. The vehicle temperature control system of claim 1, wherein the in-vehicle control unit temperature control flow path comprises a plurality of control unit temperature control branches to respectively perform the first temperature control on the plurality of in-vehicle control units, and wherein each of the control unit temperature control branches corresponds to one of the communications devices.

3. The vehicle temperature control system of claim 1, further comprising in-vehicle control units connected in series.

4. The vehicle temperature control system of claim 1, wherein the temperature control plate is disposed on one side or both sides of each of the at least one control board and is configured to communicate with the temperature control branch.

5. A vehicle temperature control system, comprising:

an in-vehicle control unit temperature control flow path comprising an upstream port and a downstream port, and configured to perform a first temperature control for a first in-vehicle control unit, wherein the in-vehicle control unit temperature control flow path comprises a plurality of temperature control branches to perform the first temperature control on the first in-vehicle control unit, wherein at least one of the temperature control branches passes through the first in-vehicle control unit, wherein the first in-vehicle control unit comprises at least one control board, wherein a temperature control plate is attached to the at least one control board, wherein a guide channel is arranged in a wavy shape inside the temperature control plate, and wherein a heat transfer plate is disposed between the at least one control board and the temperature control plate;

a heat exchange unit comprising an output port and a backflow port, and configured to provide temperature control fluid for the in-vehicle control unit temperature control flow path;

a temperature sensor control unit configured to control a flow speed or flow rate of the temperature control fluid based on a collected temperature signal;

a temperature control backbone pipe comprising an upstream main pipe and a downstream main pipe, wherein the upstream main pipe is configured to separately communicate with the output port and the upstream port, and wherein the downstream main pipe is configured to separately communicate with the downstream port and the backflow port; and a plurality of three-way valves disposed on the temperature control backbone pipe, comprising:

a first three-way valve configured to couple the output port of the heat exchange unit to the upstream main pipe;

a second three-way valve configured to couple the upstream main pipe to the in- vehicle control unit temperature control flow path; and a third three-way valve configured to couple the in-vehicle control unit temperature control flow path to the downstream main pipe and to the backflow port of the heat exchange unit.

6. The vehicle temperature control system of claim 5, further comprising a plurality of in-vehicle control units comprises the first in-vehicle control unit.

7. The vehicle temperature control system of claim 5, further comprising:

a plurality of battery units; and a battery temperature control flow path configured to perform a second temperature control for the battery units, wherein the battery temperature control flow path comprises a plurality of battery unit temperature control branches to respectively perform the second temperature control on the battery units, wherein each battery unit temperature control branch corresponds to one of the battery units, wherein a second upstream port of the battery temperature control flow path is configured to communicate with the upstream main pipe, and wherein a second downstream port of the battery temperature control flow path is configured to communicate with the downstream main pipe.

8. The vehicle temperature control system of claim 5, wherein the temperature sensor control unit comprises:

a temperature sensor installed or integrated on the first in-vehicle control unit;

a flow control valve disposed on at least one of the temperature control branches or in- vehicle control unit temperature control flow path and configured to control the flow rate of the temperature control fluid; and a control unit coupled to the temperature sensor through a wired signal or a wireless signal and configured to control the flow control valve based on the collected temperature signal.

9. The vehicle temperature control system of claim 5, wherein the temperature control plate is disposed on one side of each of the at least one control board and configured to communicate with the temperature control branch.

10. The vehicle temperature control system of claim 9, wherein the temperature control plate comprises a liquid storage chamber.

11. The vehicle temperature control system of claim 9, further comprising a heat dissipation plate disposed on one side of the at least one control board, and distributed between the at least one control board and the temperature control plate.

12. The vehicle temperature control system of claim 9, further comprising a heat dissipation plate disposed on both sides of the at least one control board, and distributed between the at least one control board and the temperature control plate.

13. The vehicle temperature control system of claim 9, wherein the temperature control plate is disposed on both sides of each of the at least one control board and is configured to communicate with the temperature control plate.

14. A vehicle temperature control system, comprising:

an in-vehicle control unit comprising at least one control board, wherein a temperature control plate is attached to the at least one control board, wherein a guide channel is arranged in a wavy shape inside the temperature control plate, and wherein a heat transfer plate is disposed between the at least one control board and the temperature control plate;

an in-vehicle control unit temperature control flow path coupled to the in-vehicle control unit and configured to perform a first temperature control for the in-vehicle control unit, wherein the in-vehicle control unit temperature control flow path comprises a plurality of temperature control branches to perform the first temperature control on the in-vehicle control unit, and wherein at least one of the temperature control branches passes through the in-vehicle control unit;

a plurality of battery units;

a battery temperature control flow path coupled to the battery units and configured to perform a second temperature control for the battery units, wherein the battery temperature control flow path comprises a plurality of battery unit temperature control branches to respectively perform the second temperature control on the battery units, and wherein each of the battery unit temperature control branches corresponds to one of the battery units;

a heat exchange unit comprising an output port and a backflow port, and configured to provide temperature control fluid for the in-vehicle control unit temperature control flow path and the battery temperature control flow path;

a temperature sensor control unit configured to control a flow speed or flow rate of the temperature control fluid based on a collected temperature signal; and a control valve unit configured to control the in-vehicle control unit temperature control flow path and the battery temperature control flow path to be connected in series, and comprising a first three-way control valve disposed at a joint between upstream flow paths of the in-vehicle control unit temperature control flow path and the battery temperature control flow path, and comprising a first inlet coupled to a temperature control backbone pipe, a first outlet, and a second outlet, wherein the first outlet and the second outlet are connected respectively to the in-vehicle control unit temperature control flow path and the battery temperature control flow path; and a second three-way control valve disposed on a downstream flow path of the in- vehicle control unit temperature control flow path or the battery temperature control flow path, and comprising a second inlet connected to the battery temperature control flow path, a third outlet connected to a downstream three-way valve, and a fourth outlet connected via a bridge pipe to the in-vehicle control unit temperature control flow path.

15. The vehicle temperature control system of claim 14, wherein the temperature sensor control unit comprises:

a temperature sensor installed or integrated on the first in-vehicle control unit;

a flow control valve disposed on at least one of the temperature control branches or in- vehicle control unit temperature control flow path and configured to control the flow rate of the temperature control fluid; and a control unit coupled to the temperature sensor through a wired signal or a wireless signal and configured to control the flow control valve based on the collected temperature signal.

16. The vehicle temperature control system of claim 14, wherein the temperature control plate is disposed on both sides of each of the at least one control board and is configured to communicate with the temperature control branch.

17. The vehicle temperature control system of claim 16, wherein the temperature control plate comprises the guide channel configured to communicate with the temperature control branch.

18. The vehicle temperature control system of claim 16, further comprising a heat dissipation plate disposed on one side of the at least one control board, and distributed between the at least one control board and the temperature control plate.

19. The vehicle temperature control system of claim 14, further comprising in-vehicle control units connected in series.

20. The vehicle temperature control system of claim 14, further comprising a circulating pump configured to circulate the temperature control fluid through the heat exchange unit, the temperature control backbone pipe, and the first in-vehicle control unit.

* * * * *